United States Patent
Wang et al.

(10) Patent No.: US 7,586,341 B2
(45) Date of Patent: *Sep. 8, 2009

(54) PROGRAMMABLE HIGH-SPEED INTERFACE

(75) Inventors: Bonnie L. Wang, Cupertino, CA (US);
Chiakang Sung, Milpitas, CA (US);
Joseph Huang, San Jose, CA (US);
Khai Nguyen, San Jose, CA (US);
Philip Pan, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/830,831

(22) Filed: Jul. 30, 2007

(65) Prior Publication Data
US 2008/0186056 A1 Aug. 7, 2008

Related U.S. Application Data

(63) Continuation of application No. 11/446,483, filed on Jun. 2, 2006, now Pat. No. 7,315,188, which is a continuation of application No. 10/886,015, filed on Jul. 6, 2004, now Pat. No. 7,116,135, which is a continuation of application No. 10/229,342, filed on Aug. 26, 2002, now Pat. No. 6,825,698.

(60) Provisional application No. 60/315,904, filed on Aug. 29, 2001.

(51) Int. Cl.
*H03B 1/00* (2006.01)

(52) U.S. Cl. .................................. 327/108; 326/82
(58) Field of Classification Search ................. None
See application file for complete search history.

(56) References Cited

U.S. PATENT DOCUMENTS

| | | | | |
|---|---|---|---|---|
| 5,929,655 A * | 7/1999 | Roe et al. | ..................... 326/82 |
| 6,433,579 B1 * | 8/2002 | Wang et al. | ..................... 326/38 |
| 6,480,026 B2 * | 11/2002 | Andrews et al. | ............... 326/39 |

* cited by examiner

*Primary Examiner*—Tuan Lam
(74) *Attorney, Agent, or Firm*—Townsend and Townsend and Crew LLP; J. Matthew Zigmant

(57) ABSTRACT

Methods and apparatus for providing either high-speed, or lower-speed, flexible inputs and outputs. An input and output structure having a high-speed input, a high-speed output, a low or moderate speed input, and an low or moderate speed output is provided. One of the input and output circuits are selected and the others are deselected. The high-speed input and output circuits are comparatively simple, in one example having only a clear signal for a control line input, and are able to interface to lower speed circuitry inside the core of an integrated circuit. The low or moderate speed input and output circuits are more flexible, for example, having preset, enable, and clear as control line inputs, and are able to support JTAG boundary testing. These parallel high and lower speed circuits are user selectable such that the input output structure is optimized between speed and functionality depending on the requirements of the application.

10 Claims, 16 Drawing Sheets

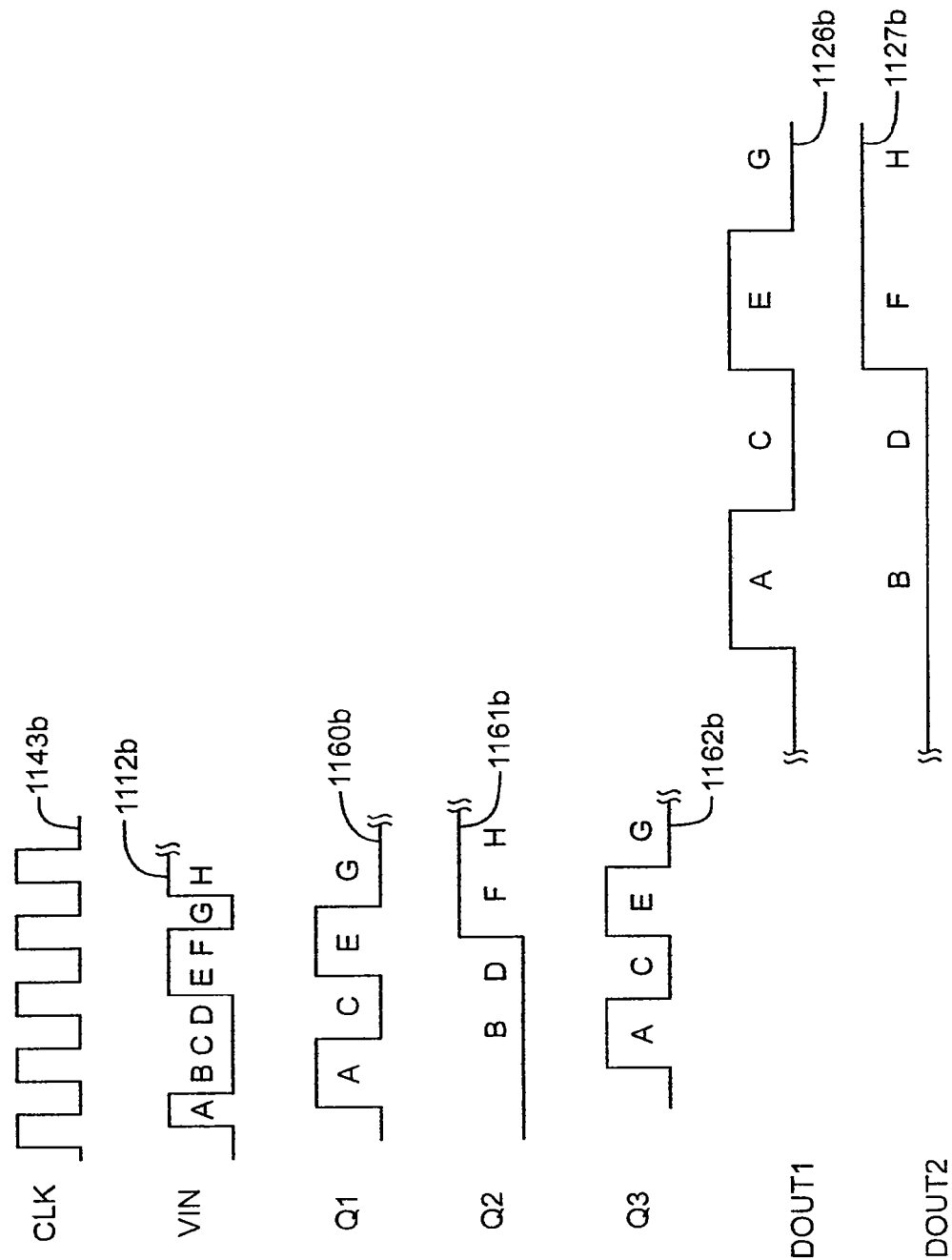

PROGRAMMABLE HIGH-SPEED INTERFACE

CROSS-REFERENCES TO RELATED APPLICATIONS

This application is a continuation of U.S. patent application Ser. No. 11/446,483 filed Jun. 2, 2006 (now U.S. Pat No. 7,315,188,), which is a continuation of U.S. patent application Ser. No. 10/886,015 filed Jul. 6, 2004 (now U.S. Pat. No. 7,116,135), which is a continuation of U.S. patent application Ser. No. 10/229,342 filed Aug. 26, 2002 (now U.S. Pat. No. 6,825,698), which claims the benefit of Provisional Application 60/315,904, filed Aug. 29, 2001, each of which are incorporated herein by reference.

BACKGROUND OF THE INVENTION

The present invention relates to input and output interfaces for integrated circuits, and more particularly to high performance interfaces that have a high degree of flexibility and configurability.

Electronic systems are becoming more complex as they handle increasingly difficult tasks. Accordingly, the amount of data transferred between integrated circuits in these systems continues to climb. At the same time, system designers want smaller, lower pin-count packages that consume less space on the system's printed circuit boards. Thus, very high data rates are desirable at integrated circuit input and output pins.

But it is also desirable for the circuits that form the input and output structures at these pins to be highly flexible. For example, sets, presets, and enables at registered inputs and outputs can ease the implementation of complicated logic functions, and JTAG boundary test access can simplify system diagnostics.

Unfortunately, increased flexibility results in slower circuits. The same transistors that add functions and increase multiplexing insert parasitic capacitances and resistances, slowing device performance. Increasing the configurability of an input and output interface decreases the maximum rate that the interface can process data. Also, to save power, integrated circuit designers want to use lower speed circuitry inside the integrated circuit.

Thus, what is needed is a highly flexible input and output interface that can also operate at high speed. For maximum utility, the interface should also be able to communicate efficiently with lower speed circuitry inside the integrated circuit.

SUMMARY

Accordingly, embodiments of the present invention provide methods and apparatus for providing either high-speed, or lower-speed inputs and outputs. An input and output structure having a high-speed input, a high-speed output, a low or moderate speed input, and an low or moderate speed output is provided. One of the input and output circuits are selected and the others are deselected. The high-speed input and output circuits are comparatively simple, in one example having only a clear signal for a control line input, and are able to interface to lower speed circuitry inside the core of an integrated circuit. The low or moderate speed input and output circuits are more flexible, for example, having preset, enable, and clear as control line inputs, and are able to support JTAG boundary testing. These parallel high and lower speed circuits are user selectable such that the input output structure is optimized between speed and functionality depending on the requirements of the application.

One exemplary embodiment of the present invention provides an integrated circuit including a pad, a high-speed output buffer connected to the pad, and a low-speed output buffer also connected to the pad. The high-speed output buffer and the low-speed output buffer are selectably activated. When the high-speed output buffer is active, the low-speed output buffer is inactive, and when the low-speed output buffer is active, the high-speed output buffer is inactive.

This embodiment may further provide a first flip-flop connected to the high-speed output buffer, and a second flip-flop connected to the low-speed output buffer. The first flip-flop is configured to receive a first number of control signals and the second flip-flop is configured to receive a second number of control signals, the second number greater than the first number.

Another exemplary embodiment of the present invention provides an integrated circuit including a pad, a high-speed input buffer connected to the pad, and a low-speed input buffer also connected to the pad. The high-speed input buffer and the low-speed input buffer are selectably activated. When the high-speed input buffer is active, the low-speed input buffer is inactive, and when the low-speed input buffer is active, the high-speed input buffer is inactive.

This embodiment may further provide a first flip-flop connected to the high-speed input buffer, and a second flip-flop connected to the low-speed input buffer. The first flip-flop is configured to receive a first number of control signals and the second flip-flop is configured to receive a second number of control signals, the second number greater than the first number.

A further embodiment provides an integrated circuit including a high-speed output path. This path includes a first double-data rate register connected to a first output buffer. This integrated circuit also includes a low-speed output path having a second double-data register connected to a second output buffer, a high-speed input path having a third double-data rate register connected to a first input buffer, and a low-speed input path having a fourth double-data register connected to a second input buffer. The first output buffer, the second output buffer, the first input buffer, and the second input buffer are connected to a pad.

A better understanding of the nature and advantages of the present invention may be gained with reference to the following detailed description and the accompanying drawings.

BRIEF DESCRIPTION OF THE DRAWINGS

FIG. 11B is a timing diagram illustrating an alternative operation of the input circuitry of FIG. 10;

DESCRIPTION OF EXEMPLARY EMBODIMENTS

Figure 1:
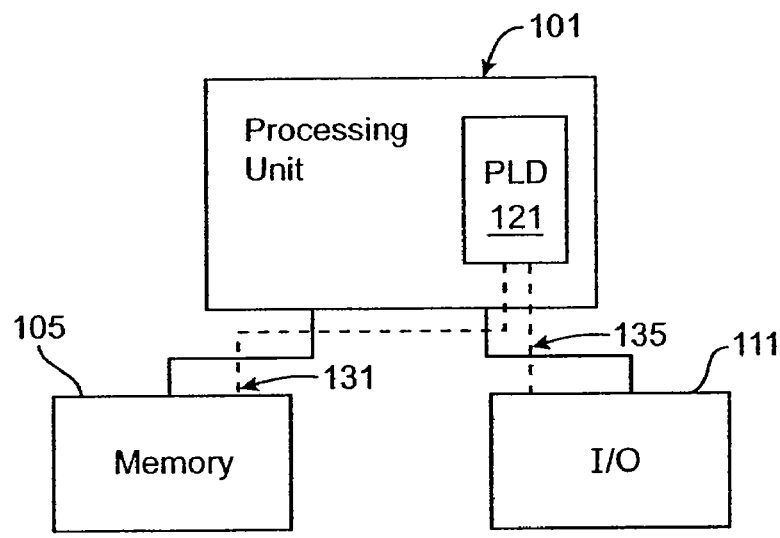
FIG. 1 is diagram of a digital system with a programmable logic integrated circuit.

FIG. 1 shows a block diagram of a digital system, within which input and output interfaces consistent with the present invention may be embodied. The system may be provided on a single board, on multiple boards, or within multiple enclosures. Though embodiments of the present invention are useful in electronic and integrated circuits in general, they are particularly useful in programmable logic devices. FIG. 1 illustrates a system 101 in which such a programmable logic device 121 may be utilized. Programmable logic devices or programmable logic integrated circuits are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. Examples of current programmable logic devices are represented by Altera's Classic, MAX®, FLEX®, APEX™ series of PLDs. These are described in, for example, U.S. Pat. Nos. 4,617,479, 4,871,930, 5,241,224, 5,258,668, 5,260,610, 5,260,611, 5,436,575, and the *Altera Data Book* (1999). Programmable logic integrated circuits and their operation are well known to those of skill in the art.

In the particular embodiment of FIG. 1, a processing unit 101 is coupled to a memory 105 and an I/O 111, and incorporates a programmable logic device 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, Internet communications and networking, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, network controller, or other processing unit. Furthermore, in many embodiments, there is often no need for a CPU. For example, instead of a CPU, one or more PLDs 121 may control the logical operations of the system. In an embodiment, PLD 121 acts as a reconfigurable processor, which can be reprogrammed as needed to handle a particular computing task. Alternately, programmable logic device 121 may include a processor. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
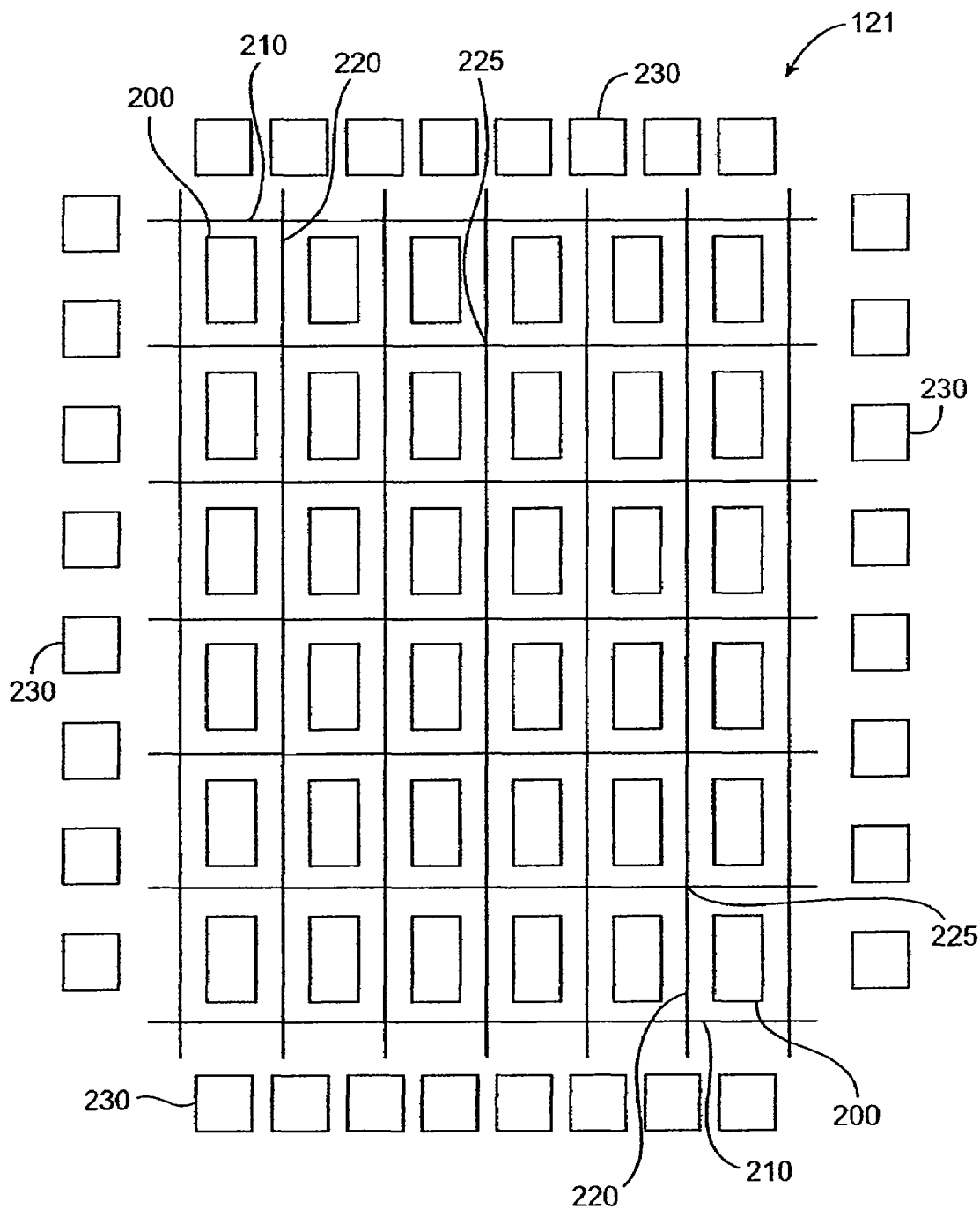
FIG. 2 is a diagram showing a floor plan of a programmable logic integrated circuit with an embedded processor.

FIG. 2 is a simplified block diagram of an overall internal architecture and organization of a PLD. Many details of programmable logic architecture, organization, and circuit design are not necessary for an understanding of the present invention and such details are not shown.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB is described in more detail below. The programmable logic portion may contain any arbitrary number of LABs. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown), some of which may be consistent with the present invention, and which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location of PLD portion 154 to another LAB 200 at another location of PLD portion 154. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The programmable logic architecture in FIG. 2 further shows at the peripheries of the chip, input and output circuits 230. Input and output circuits 230 are for interfacing the PLD to external, off-chip circuitry. Some or all of these input and output circuits 230 may be consistent with embodiments of the present invention. FIG. 2 shows thirty-two input and output circuits 230; however, a programmable logic integrated circuit may contain any number of input and output circuits, more or less than the number depicted. As discussed above, some of these input-output drivers may be shared between the embedded processor and programmable logic portions. Each input and output circuit 230 is configurable for use as an input driver, output driver, or bidirectional driver. In other embodiments of a programmable logic integrated circuit, the input and output circuits may be embedded with the integrated circuit core itself. This embedded placement of the input and output circuits may be used with flip chip packaging and will minimize the parasitics of routing the signals to input and output circuits.

Figure 3:
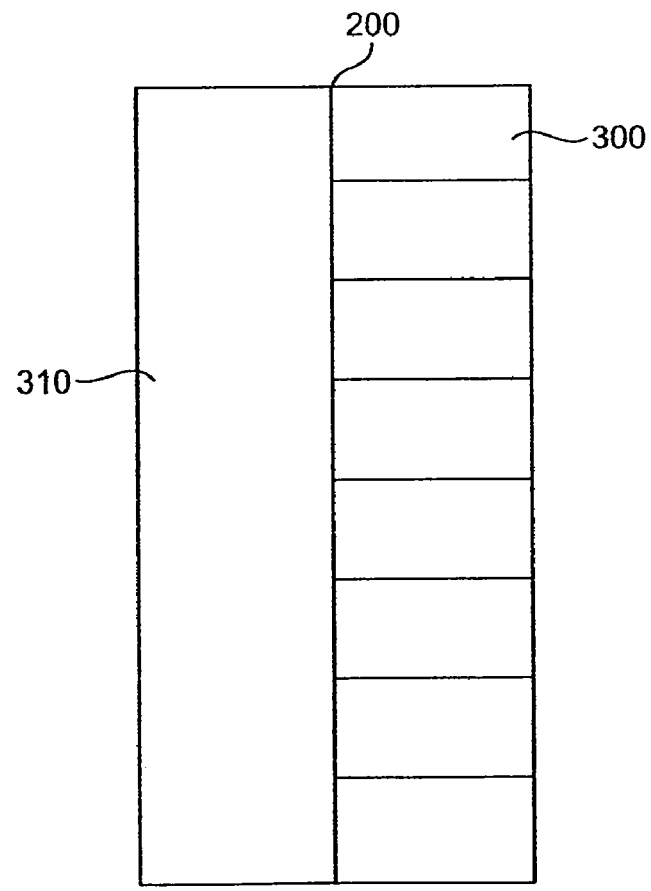
FIG. 3 is a simplified block diagram of a logic array block (LAB)

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4:
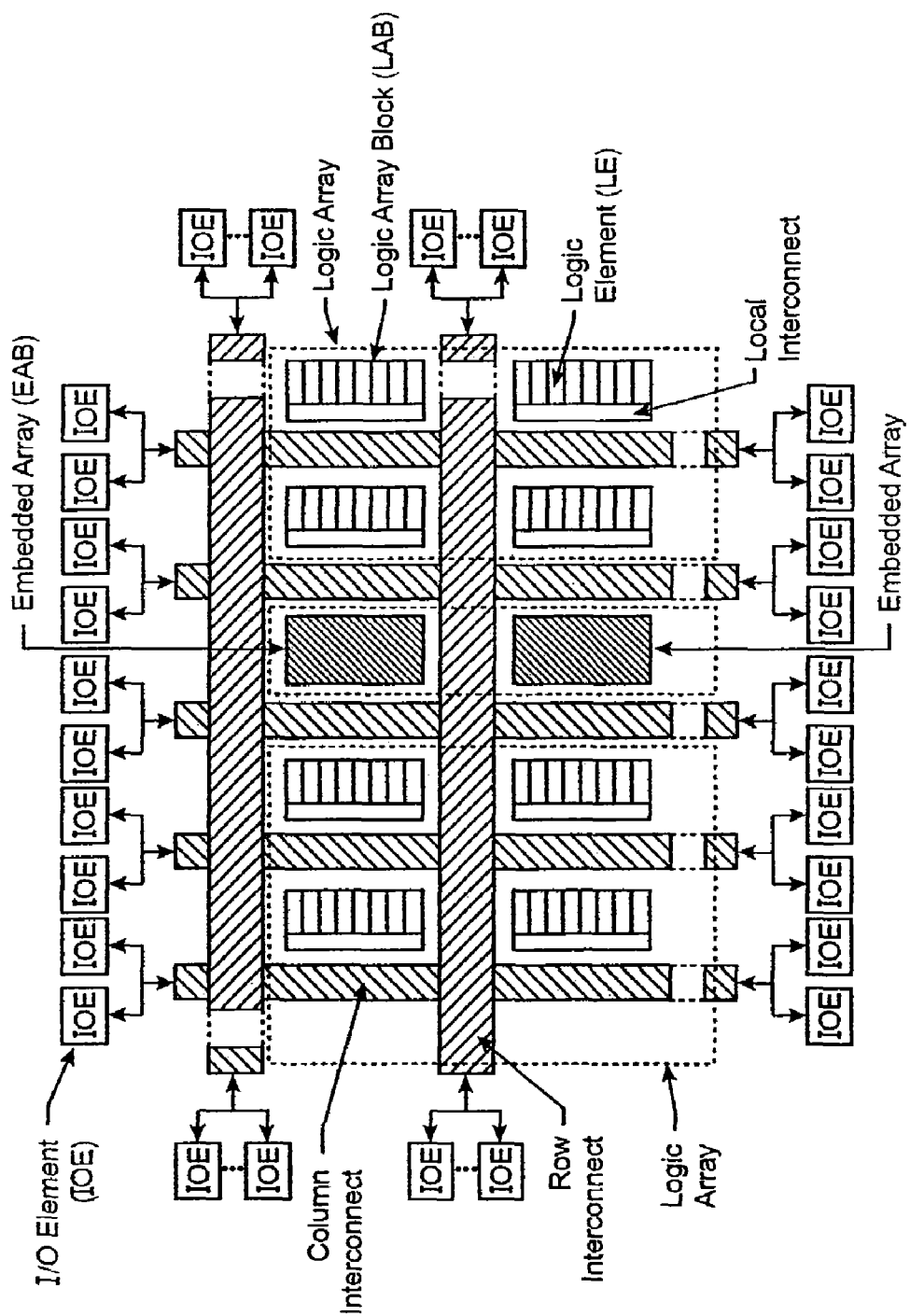
FIG. 4 is a diagram showing the programmable logic portion of the programmable logic integrated circuit.

FIG. 4 shows a programmable logic architecture. The architecture in FIG. 4 further includes (small) embedded array blocks (EABs). EABs contain user memory, a flexible block of RAM. More discussion of this architecture may be found in the *Altera Data Book* (1999) in the description of the FLEX 10K product family and also in U.S. Pat. No. 5,550, 782. Some or all of the input/output elements may be consistent with embodiments of the present invention. The embedded array blocks can be configured as FIFOs acting as frequency translators and serial to parallel converters for interfacing between high-speed input and outputs and the core circuits including the logic array blocks. Other architectures such as Altera's APEX™ and Stratix™ families of products are described in detail in their respective data sheets, available from Altera Corporation, 101 Innovation Drive, San Jose, Calif. 95134.

Figure 5:
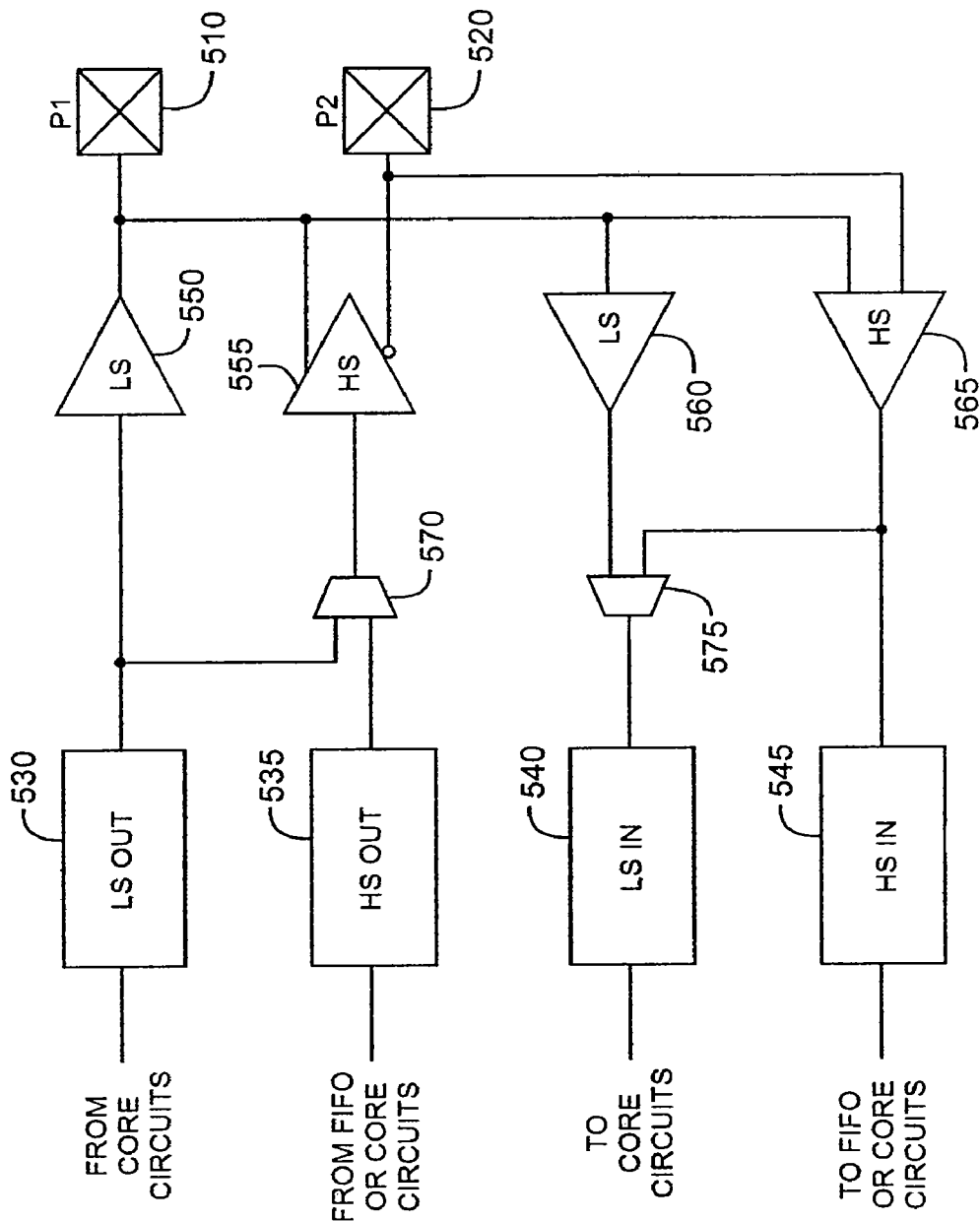
FIG. 5 is a block diagram illustrating input and output circuitry consistent with an embodiment of the present invention.

FIG. 5 is a block diagram illustrating input and output circuitry consistent with an embodiment of the present invention. Included are a low-speed output circuit 530, low-speed output buffer 550, high-speed output circuit 535, high-speed output buffer 550, low-speed input buffer 560, low-speed input circuit 540, high-speed input buffer 565, high-speed input circuit 545, multiplexers 570 and 575, and pads P1 510 and P2 520. Low-speed output circuit 530 and low-speed output buffer 550 form a low-speed output path for providing signals from core circuits to the pad P1 510. A high-speed output path is provided by high-speed output circuit 535 and high-speed output buffer 555. This path receives signals from FIFOs or other core circuits and provides a differential output on pads P1 510 and P2 520.

Low-speed input buffer 560 and low-speed input circuit 540 form a low-speed input path for receiving signals on pads P1 510 and providing outputs to the core circuitry. A high-speed input path is provided by high-speed input buffer 565 and high-speed input circuit 545. This path receives differential inputs on pads P1 510 and P2 520 and provides signals to FIFOs or other circuits in the core.

Additionally, multiplexer 570 provides a low-speed path including the low-speed output circuit 530 and high-speed differential output buffer 555. In this way, low-speed signals from the core circuits may be provided as differential output signals. Similarly, differential input signals may be received by high-speed input buffer 565 and provided through multiplexer 575 to the low-speed input circuit 540. In this way, a low-speed differential input signal may be received and output to the core circuits.

In a specific embodiment of the present invention, the low-speed output circuit 530, the high-speed output circuit 535, low-speed input circuit 540, and high-speed input circuit 545 are double data rate registers. The labels high speed and low speed are relative terms, and are not descriptive of any specific data rate.

Figure 6:
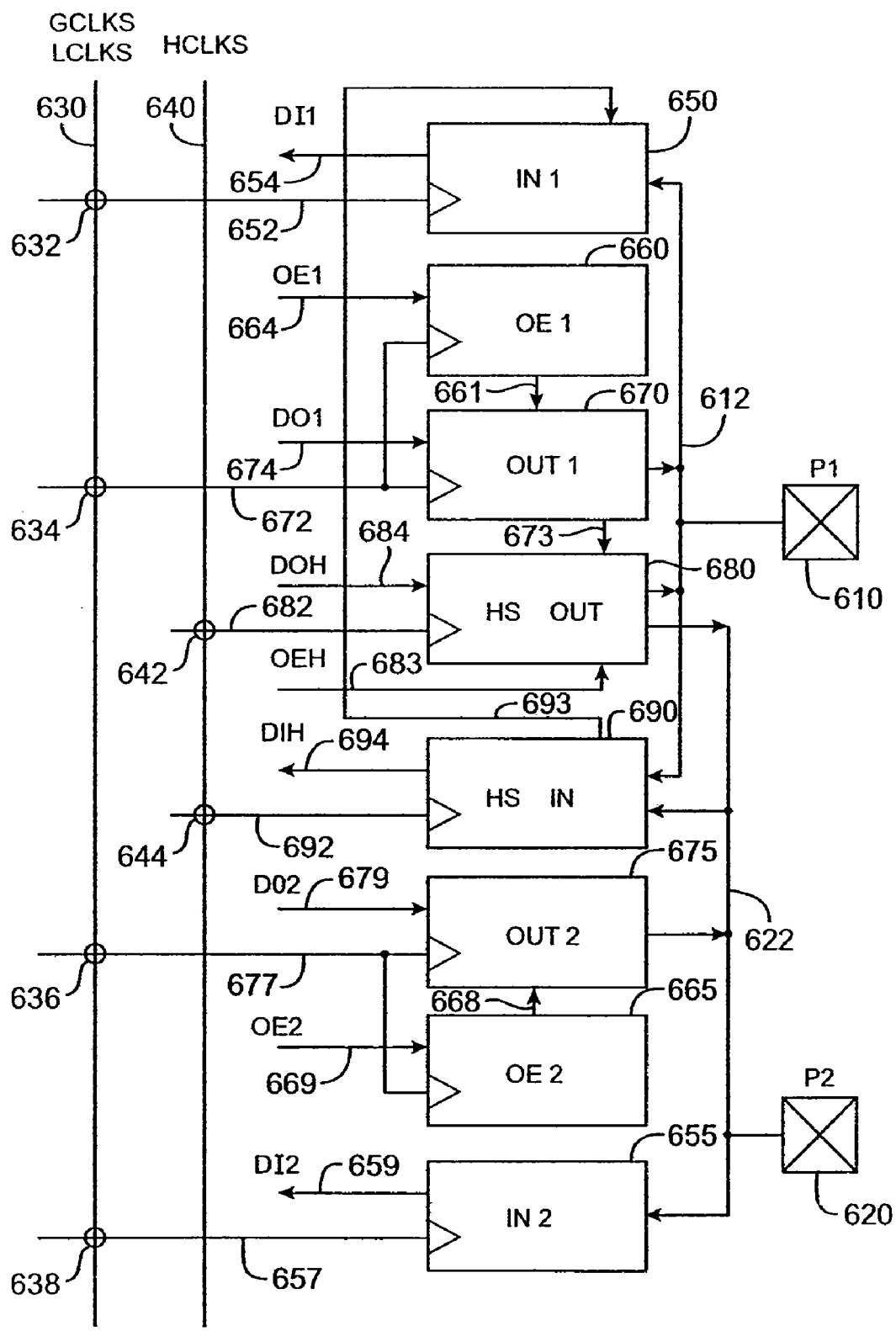
FIG. 6 is another block diagram illustrating input and output circuitry consistent with an embodiment of the present invention.

FIG. 6 is another block diagram illustrating input and output circuitry consistent with an embodiment of the present invention. This figure, as with all the included figures, is shown for exemplary purposes only, and are not intended to limit either the possible embodiments of the present invention or the claims.

Included are pads P1 610 and P2 620, input block IN1 650, output block OUT1 670, high-speed output block HSOUT 680, high-speed input block HSIN 690, output block OUT2 675, and input block IN2 655. Also included are output enable blocks OE1 660 and OE2 665.

Each input, output, and output enable block may be synchronous or asynchronous. In one embodiment, global (GCLKs) and local (LCLKs) clock lines 630, and high-speed clock lines (HCLKs) 640 are provided. In a specific embodiments of the present invention, several low or moderate speed global clock lines are available to circuits throughout the integrated circuit. Additionally, several low or moderate speed local clocks are available. These local clocks are available and routed to only a portion of the integrated circuit, for example, one-quarter of the integrated circuit.

In addition to these low and moderate speed clocks, several high-speed clocks, HCLKs 640, are also available. These clocks, as with the local and global clock lines, may be single-ended or differential. The use of the terms low, moderate, and high speed are meant to be relative terms—one skilled in the art appreciates that what is now high speed will soon be moderate speed.

Input and output lines to and from the input and output blocks may be provided directly to and from logic gates or logic array blocks in the core of the integrated circuit. Alternately, these input and output signals may be provided to and from first-in-first-out (FIFO) memories that can serve as data buffers or frequency translators.

These input and output circuits are selectable such that pads P1 610 and P2 620 can provide:
  One high-speed differential output;
  one high-speed differential input;
  one moderate or low-speed differential output;
  one moderate or low-speed differential input;
  two single-ended inputs;
  two single-ended outputs; or
  one single-ended input and one single-ended output.

Signal paths are selectable by multiplexing signals, opening and shorting pass devices, or by using other selecting structures. A specific embodiment uses multiplexers to either couple or disconnect circuits from the input and output pads. The input and output circuits of other embodiments may be selectable such that they provide more, different, or fewer types of inputs and outputs than the above list.

When the circuitry in FIG. 6 is configured as a high-speed output, the high-speed output block HSOUT 680 is selected, while the other blocks are deselected. Output signal DOH is received on line 684. The signal DOH may be received from logic gates in the core of the integrated circuit, or a FIFO. For example, DOH may be provided by a FIFO which receives data at a low or moderate frequency from circuitry inside the integrated circuit, and outputs data at a higher frequency. A clock signal is received on line 682 which is selectively coupled to one of the high-speed clocks 640 by pass gates 642. An output enable signal OEH is received on line 683, which enables or disables the high-speed output circuit. Differential high-speed outputs are provided on pads P1 610 and P2 620.

When the circuitry in FIG. 6 is configured to provide a differential high-speed input, the high-speed input block 690 is selected, while the other input and output circuits are deselected. The differential high-speed inputs are received at pads P1 610 and P2 620. The high-speed signal DIH is provided to the core of the integrated circuit on line 694. Signal DIH may be received by high-speed circuitry inside the integrated circuit, or it may be received by a FIFO, the output of which is clocked at a lower speed. A high-speed clock signal is provided to the high-speed input block on line 692, which is selectively coupled to one of the high-speed clocks 640 by the pass devices 644.

This circuitry may also be configured such that each pad provides a moderate or low-speed single-ended output. For example, output block OUT1 670 may be selected, while the high-speed output block HSOUT 680 and input block IN1 650 are deselected. Output block OUT1 670 provides an output signal on line 612 to output pad P1 610. Input signal DO1 is received on line 674, again from either core circuitry or a translation FIFO. A low or moderate speed clock signal is received on line 672 from one of global or local clocks 630 by pass device 634. Output block OUT1 may be enabled and disabled by output enable circuitry OE1 660. In this particular example, the output enable circuit 660 and output circuit 670 received the same clocks signal on line 672. In other embodiments, these blocks may receive individual clock signals. The output enable block OE1 660 receives an output enable signal 664 from the core of the integrated circuit and provides an enable signal on line 661 to output block OUT1 670. Similar circuitry is provided by output block OUT2 675 and output enable blocked OE2 665, which are coupled to pad P2 620.

The circuitry of FIG. 6 can also be configured such that one or both pads P1 610 and P2 620 may also receive a single-ended input signal. For example, a single-ended input signal may be received at pad P1 610 and provided on line 612 to input circuit IN1 650. Input circuit IN1 650 provides an input signal to the rest of the chip on line DI1 654. DI1 may be provided to core circuitry in the integrated circuit or to a FIFO, as before. A clock signal is received on line 652 from one of the global or local clocks 630 through pass devices 632. Similar circuit is provided by input block IN2 655, which is coupled to pad P2 620.

Additionally, other signal lines are provided, such as signal line 693, which provides a path allowing for this circuitry to be configured as a moderate or low-speed differential input where a differential input received on pads P1 610 and P2 620 is provided as an output DI1 on line 654. Additionally, signal path 673 is provided such that a moderate or low-speed output signal DO1 674 received by output block OUT1 670 is provided as a differential output to pads P1 610 and P2 620.

The more flexible, lower-speed input and output circuits provide additional configurability. For example, the lower speed circuitry may selectively couple to a larger selection of clock lines operating a different frequencies and different phases. Also, JTAG boundary testing may be supported. In a specific embodiment, a more precisely timed output enable signal is available on the lower speed output buffer or driver, and the lower speed circuits may coupled to either a FIFO or directly to the core logic array blocks, while the higher speed input and output circuits typically require the frequency translation capabilities of a FIFO. Also, the lower speed circuits include presets, clear, and enable functions, as opposed to only a clear function in the high-speed circuit. Moreover, since the lower speed circuits are single-ended, two pads may be used as two output pads, two input pads, or 1 input and 1 output pad for the lower speed circuits, whereas two pads are required for just one high-speed input or output, because of their differential nature.

Figure 7:
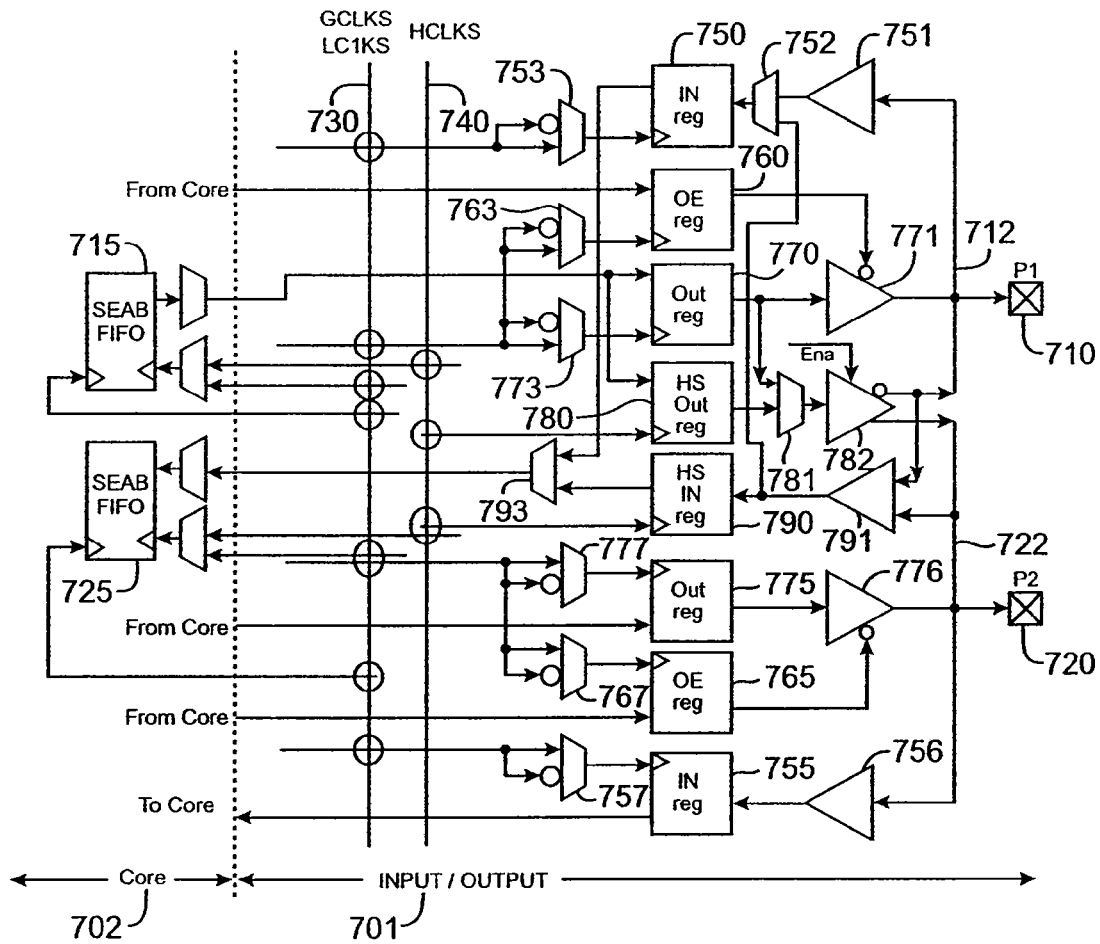
FIG. 7 is a more detailed block diagram of an input and output interface consistent with an embodiment of the present invention.

FIG. 7 is a block diagram of an input and output interface consistent with an embodiment of the present invention. Included are pads P1 710 and P2 720 connected to input and output circuitry 701, which interfaces to core circuits 702 and FIFOs 715 and 725. Often, the core circuits 702 and FIFOs 715 and 725 are located in the center of an integrated circuit, while the input and output circuitry 701 is located around the perimeter of the integrated circuit and the pads are located along its edge.

The input and output registers may each be a double-data rate register. Alternately, each register may be a single flip-flop. Accordingly, each input and output line from the register to the FIFOs 715 and 725 may be one or more data lines. For example, if an output register is a double-data rate register, the input line shown may be made up of two data lines. Each data line may be one line for single-ended, or two lines for differential signaling. When a double-data rate register is coupled to a FIFO, each FIFO shown may be a single FIFO with two outputs, or two separate FIFOs.

A high-speed differential output path is provided by the FIFO 715, output register 780, multiplexer 781, and differential output buffer or driver 782. When the circuitry of FIG. 7 is selectively configured to provide a high-speed differential output, these circuits are typically selectively activated, while the other circuits are deactivated. For example, the activated circuits may be coupled to the output pads through a multiplexer, while the deactivated circuits are disconnected by other multiplexers. Also, to save power, the clock inputs to the deactivated circuits may be disconnected, that is, not connected to an active clock line through a pass device or other connection. These multiplexers, pass devices, and other connections may be controlled by programmable bits, dynamic signals, or by other means. Programmable bits may be stored in EEPROM, Flash, SRAM, DRAM, MRAM, fuse, antifuse, or other circuits. Dynamic signals may be generated by core logic blocks, external circuits, or other sources.

The FIFO 715 receives an input signal (not shown) from the core circuits and provides an output coupled to the input of the high-speed output register 780. Often, the FIFO 715 acts as a buffer and frequency translator between the lower frequency core circuits and the high frequency differential output. The high-speed output register 780 is clocked by one of the high-speed clock lines 740. The output of the high-speed register is provided to multiplexer 781, which in turn drives output buffer 782. Output buffer 782 provides inverting and noninverting output signals to pads P2 720 and P1 710. The differential output buffer 782 can provide output signals that are selectively compatible with one or more standards or conventions. For example, the output buffer 782 may provide output signals that are compatible with one or more of the following: LVDS, LVPECL, Hypertransport, and PCML. These high-frequency input and output standards and conventions are typically specify differential signaling. Accordingly, the high-speed input and output circuits often require the use of two pads.

A high-speed differential input path is provided by differential input buffer or driver 791, high-speed input register 790, multiplexer 793, and FIFO 725. When the input and output circuitry of FIG. 7 is selectively configured to provide a high-speed differential input, typically these circuits are selectively activated, while the remaining circuits are deactivated. A high-speed differential input signal is received on pads P1 710 and P2 720 and provided to differential input buffer 791, which provides an input signal to the high-speed input register 790. The high-speed input register 790 provides an output through the multiplexer 793 to the FIFO 725. The high-speed input register 790 is clocked by one of the high-speed clock HCLKs 740. Typically the FIFO 725 provides a frequency translation for the high-speed input register to the lower speed core circuitry in the core 702. The differential input buffer 791 can receive input signals that are compatible and with one or more standards or conventions. For example, the input buffer 791 may receive input signals which are compatible with one or more of the following: LVDS, LVPECL, Hypertransport, and PCML.

A single-ended output signal may be provided on pad P1 710 by the output register 770 and output buffer or driver 771. When a single-ended output signal is provided on pad PI 710, typically these circuits are active, while the other associated circuits in the input and output circuits 701, such as the input register 750, input buffer 751, high-speed output register 780, and high-speed input register 790, are inactive. Signals are received by the output register 770 from core circuits 702 or the FIFO 715. The output register 770 provides output signals to the single-ended output buffer 771, which in turn drives pad P1 710. The output buffer 771 may be enabled and disabled by the output enable register 760. The output register 770 and output enable register 760 may be clocked by true or complementary versions of one of the global or local clocks 730. In this specific example, clock multiplexers 763 and 773, which clock output enable register 760 and output register 770 respectively, are coupled to the same clock line. In other embodiments, these multiplexers may be coupled to separate clock lines. The output buffer 771 may provide outputs that are in compliance with one or more standards or conventions. For example, the output buffer 771 may provide signals which are compliance with one or more of the following; LVTTL, LVCMOS, SSTL, and TTL. Similarly, single-ended output signals may be provided to pad P2 720 by the output register 775 and output buffer 776, which is enabled by output enable register 765.

Single-ended input signals may be received from pad P1 710 using input buffer 751 and input register 750. When single-ended input signals are received on pad PI, typically these circuits are active, while other associated circuits, such as output register 770, output buffer 771, output enable register 760, high-speed output register 780, and high-speed input register 790, are inactive. Signals received on pad P1 710 are routed on line 712 to input buffer 751. Input buffer 751 may be compliant with one or more specifications or conventions. For example input buffer 751 may be compliant with one or more of the following: LVTTL, LVCMOS, SSTL, and TTL. Input buffer 751 provides an input signal to the input register 750 which may in turn drive FIFO 725 or other circuits in the core 702. Input register 750 is clocked by true or complementary versions of a clock signal from one of the global or local clock lines 730 by multiplexer 753. Similarly, single-ended input signals may be received from pad P2 720 by buffer 756, which drives input register 755.

These input and output circuits 701 may be selectively enabled in other configurations. For example, the differential input buffer 791 may have its output routed through multiplexer 752 to the input register 750. Also, the output register 770 may have its output routed through multiplexer 781 to the differential output buffer 782. In other embodiments of the present invention, other combinations of inputs and output circuits 701 may be selectively enabled, and selectively coupled to FIFOs 715 and 725, and core circuits 702.

The FIFOs 715 and 725 provide a frequency translation between the high-speed input and output circuits and the lower speed core logic array blocks. Specifically, each FIFO may be formed from a small embedded array block (SEAB) or another embedded memory block. A SEAB is a type of embedded memory blocks found on the Altera Stratix devices. When the circuit of FIG. 7 is configured as a high-speed input, data signals from the high-speed input register 790 are serially received and stored by FIFO 725. This data may be output by FIFO 725 at a lower frequency in one of two ways. First, the read port of the FIFO 725 may be wider than its write port. In this way, the FIFO 725 performs a serial-to-parallel data conversion that translates the high-speed input data to a lower frequency. Second, the read port of the FIFO 725 may be clocked at a lower frequency than its write port. In this way, high-speed data that is written serially at a high frequency, is read serially at a lower frequency. Care should be taken to avoid buffer overruns in this case. When the circuit of FIG. 7 is configured as a high-speed output, data signals from the core logic array blocks may be received serially or in parallel by the FIFO 715. If data is received in parallel by the FIFO 715, it may be read out serially to the high-speed output register 770. Again, this provides a frequency translation from the lower speed core logic array blocks to the high-speed output register 770. Alternately, if data is received in serially by FIFO 715, it may be clocked out serially at a higher frequency and set to the output register 770. Care should be taken to avoid buffer under runs in this case.

Figures 8A, 8B:
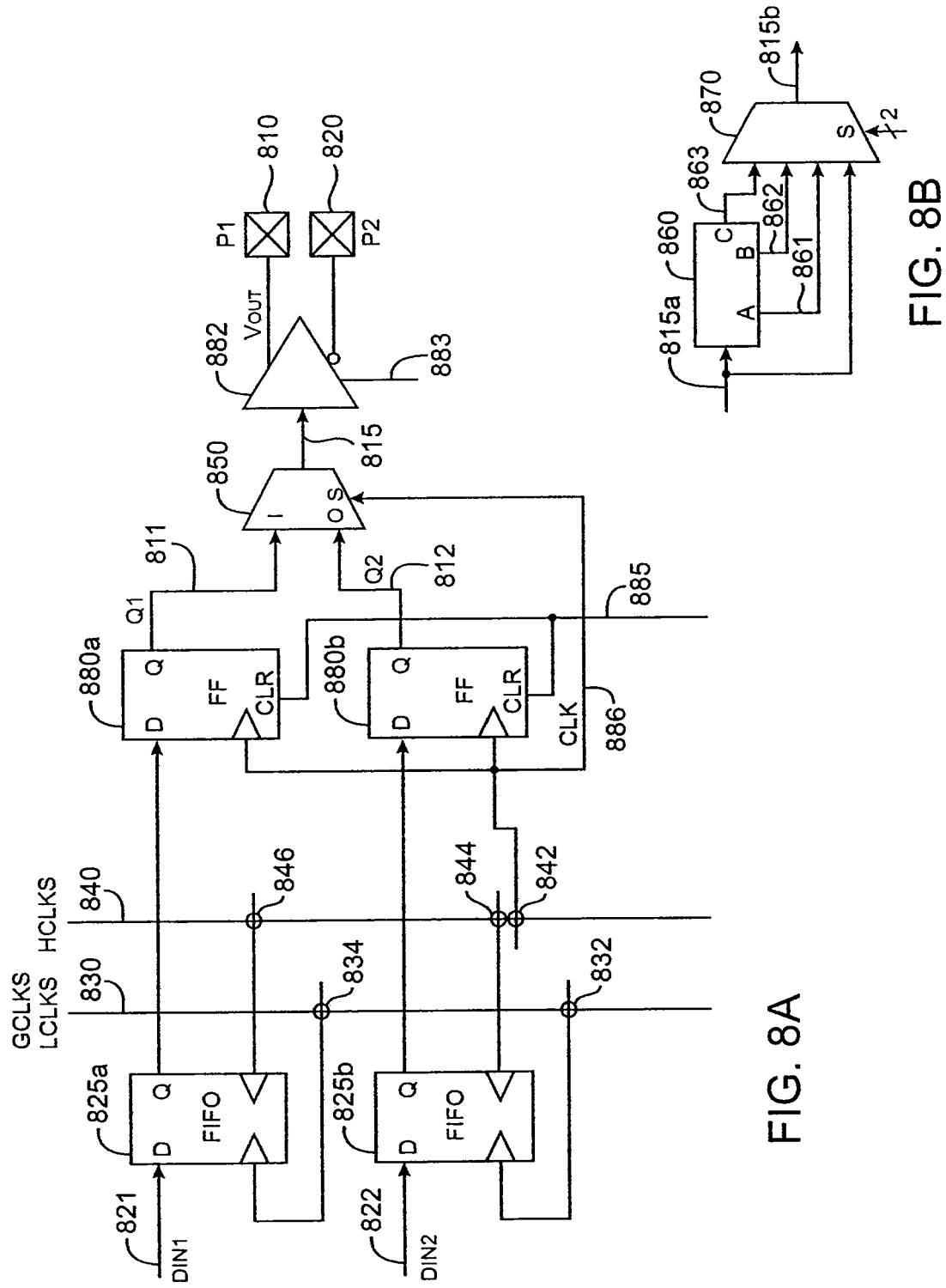
FIG. 8A is a block diagram showing more detail of a high-speed differential output which may be used as HSOUT in FIG. 6, the high-speed output register and differential output buffer in FIG. 7, or other circuits in other embodiments of the present invention.
FIG. 8B illustrates an adjustable delay line which may be used in embodiments of the present invention.

FIG. 8A is a block diagram showing more detail of a high-speed differential output which may be used as HSOUT 680 in FIG. 6, the high-speed output register 780 and differential output buffer 782 in FIG. 7, or other circuits in other embodiments of the present invention. Included are FIFOs 825a and 825b, flip-flops 880a and 880b, multiplexer 850, and output buffer 882. The FIFOs 825a and 825b may alternately be one FIFO having two outputs. Flip-flops 880a and 880b, and multiplexer 850 form a double-data rate output register. A second multiplexer connected to the output of multiplexer 850 may be used to provide another signal path for accessing the differential output buffer 882. This second multiplexer can also be used to disconnect the high-speed registers from the output buffer when the high-speed output is deactivated and not selected. Additional multiplexers or pass devices may be inserted in the register data and clock input paths to deactivate this path and save power. It will be appreciated by one skilled in the art that other modifications may be made to this circuitry consistent with the present invention.

Input signals are received on lines DIN1 821 and DIN2 822 by FIFOs 825a and 825b. In this example, the input signals are clocked into the FIFOs by global or local clocks 830 selected by pass devices 834 and 832. The FIFO 825a provides an output that is received by flip-flop 880a. The FIFO 825b provides an output that is received by flip-flop 880b. The output signals of the FIFOs 825a and 825b are clocked by high-speed clock lines 840 selected by pass devices 846 and 844. The flip-flops 880a and 880b are also clocked by one of the high-speed clock lines 840, selected by pass devices 842. The output of the flip-flops 880a and 880b are provided as inputs to multiplexer 850, the output of which is selected by the same clock signal as received by the flip-flops. The output of multiplexer 850 is provided to the differential high-speed output buffer 882, which in turn drives pads P1 810 and P2 820.

By multiplexing between flip-flops 880a and 880b during each clock cycle, the data rate of the output signal is twice that of the flip-flop outputs Q1 811 and Q2 812. Furthermore, data may be received in parallel at the FIFO inputs DIN1 821 and DIN2 822. For example, four bits of data may be received by FIFO 825a at input DIN1 821, and four bits may be received by FIFO 825b at input DIN2 822. Four bits from each FIFO may be clocked into the flip-flops 880a and 880b at four times the data rate of the data transfer at DIN1 821 and DIN2 822. By multiplexing the outputs of flip-flops 880a and 880b with multiplexer 850, the data rate is effectively doubled again, an increase of a factor of eight in the data rate of VOUT as compared to DIN1 821 and DIN2 822. In other embodiments, more or less than four bits may be received in parallel by the FIFOs, resulting in higher or lower data translation rates.

If the output of FIFO 825a is held high and the output of FIFO 825b is held low, the resulting output signal is a high-speed clock comprising alternating zeros and ones. Specifically, if DIN1 on line 821 is held high and DIN2 on line 822 is held low, the output of FIFO 825a, and thus Q1 on line 811 are high, while the output of FIFO 825b and thus Q2 on line 812 are low. The multiplexer 850 alternately selects between the high signal Q1 on line 811 and the low signal Q2 on line 812, thus generating a clock signal. Alternately, the inputs to the flip-flops 880a and 880b may couple to multiplexers having as selectable inputs logic high or logic low levels.

A clear line is provided to flip-flops 880a and 880b on line 885. To achieve the highest speed possible, it is desirable to limit the functionality of flip-flops 880a and 880b. Accordingly, these flip-flops do not include preset or enable lines. In other embodiments, these lines may be included. In other embodiments a clear line 885 may not be included thereby simplifying the structure of flip-flops 880a and 880b even further.

FIG. 8B illustrates an adjustable delay line which may be used in specific embodiments of the present invention. For example, input line 815a may be coupled to the output of multiplexer 850, while output line 815b is coupled to the input of the high-speed differential output buffer 882. The adjustable delay line includes a delay line 860 and multiplexer 870. Signals received on line 815a are delayed and provided as outputs on lines 861, 862, and 863. These lines may correspond to taps and an output of a delay line. These lines, along with the input signal on line 815a are selectable by multiplexer 870 and output on line 815b. In this way, the clock-to-Q delay of the differential output may be adjusted. This is useful in optimizing set-up and hold times. Similar adjustable delay lines may be inserted at an appropriate location in each of the included input and output circuits.

Figure 9A:
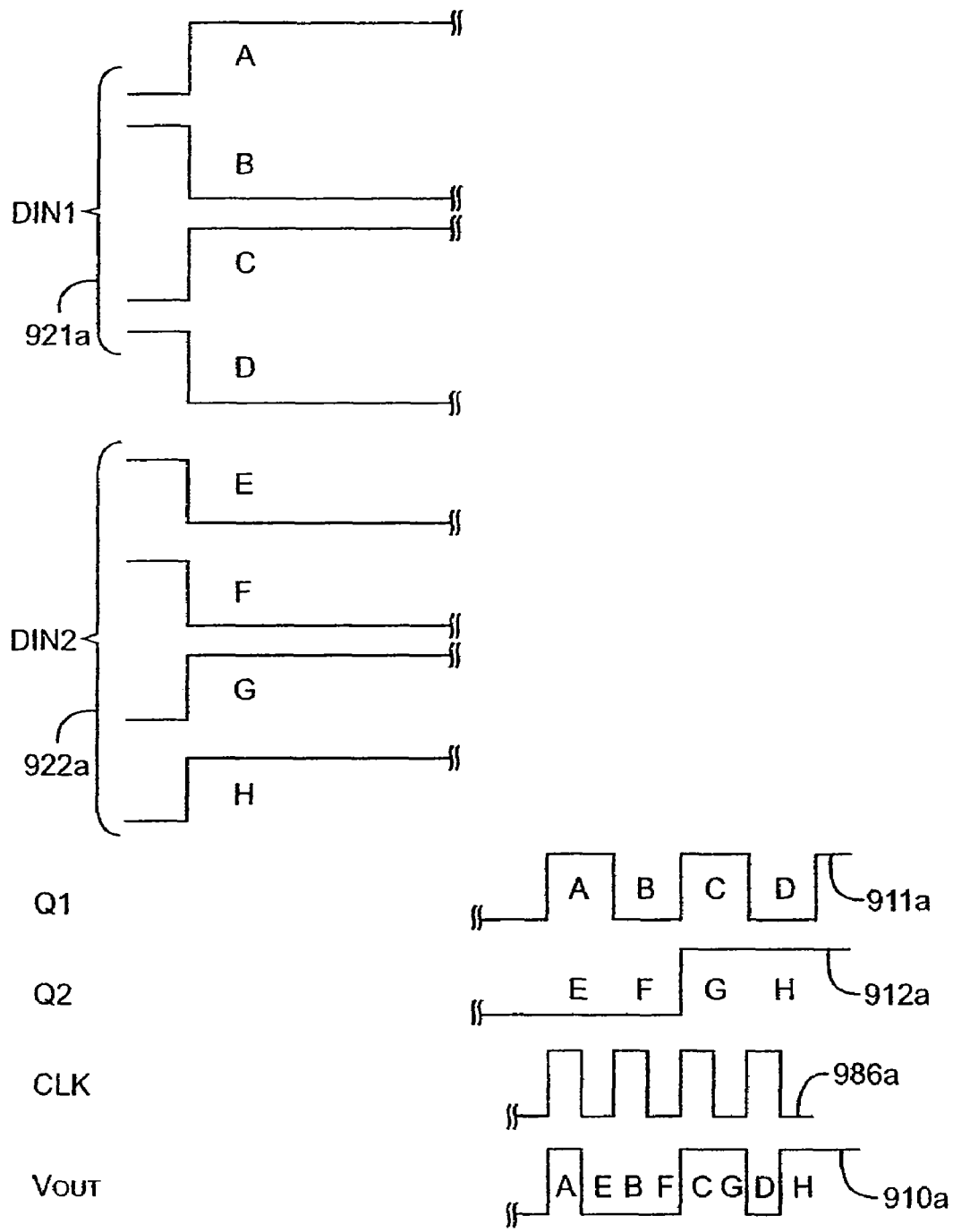
FIG. 9A is a timing diagram illustrating the operation of the output circuitry of FIG. 8A.

FIG. 9A is a timing diagram illustrating the operation of the output circuitry of FIG. 8A. Included are FIFO input signals DIN 921a and DIN2 922a, flip-flop outputs Q1 91 1a and Q2 912a, clock signal 986a, and output voltage Vout 910a. In this example, the write port of the FIFO is four bits wide, and a portion of the FIFO input signal DIN1 921 includes four input bits A, B, C, and D, each on one input line. A portion of the FIFO input signal DIN2 922 includes bits E, F, G, and H, each on one input line. The FIFOs store these input signals, and send them to the flip-flops 880a and 880b. These flip-flops are clocked by the clock signal 986, and output data at four times the frequency as the data rate at the input of the FIFOs 825a and 825b. Multiplexer 850 alternately selects between its inputs, doubling the data rate and interleaving the data from outputs of the flip-flops. Accordingly, Vout 910a including output bits in the sequence A, E, B, F, C, G, D, and H are provided to pads P1 810 and P2 820. As can be seen, the data rate of Vout 910a is eight times the data rate of the four input signals that make up DIN1 921a and DIN2 922a. In this specific example, DIN1 921a and DIN2 922a are four bits wide. In other embodiments, these may be more or less than four bits wide.

Figure 9B:
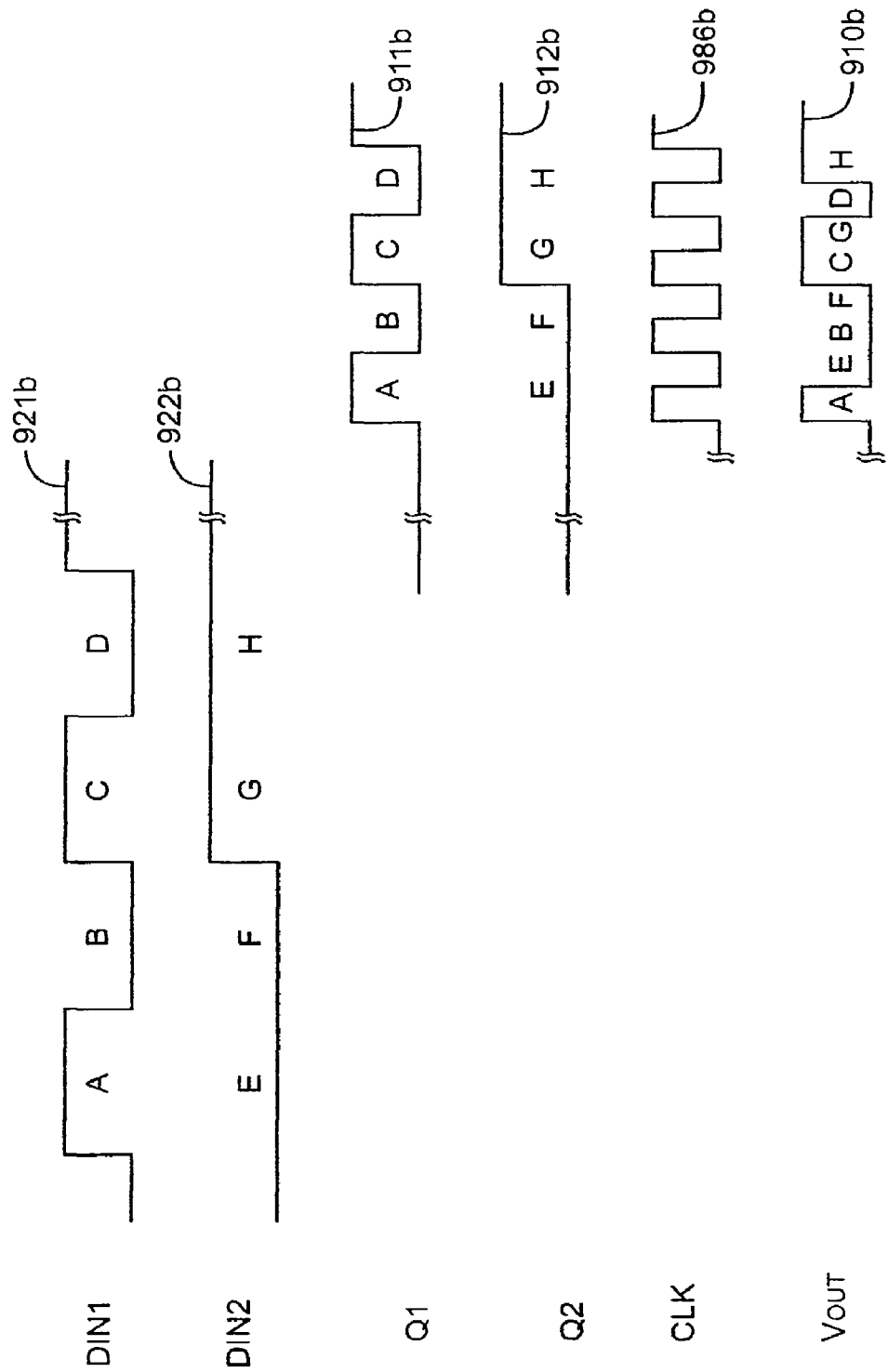
FIG. 9B is a timing diagram illustrating an alternative operation of the output circuitry of FIG. 8A.

FIG. 9B is a timing diagram illustrating an alternative operation of the output circuitry of FIG. 8A. Included are FIFO input signals DIN1 921 and DIN2 922, flip-flop outputs Q1 911 and Q2 912, clock signal 986, and output voltage Vout 910. In this example, a portion of the FIFO input signal DIN1 921 includes four input bits A, B, C, and D. A portion of the FIFO input signal DIN2 922 includes bits E, F, G, and H. The FIFOs store these input signals, and later send them to the flip-flops 880a and 880b. These flip-flops are clocked by the clock signal 986, and output at a higher frequency than the data rate at the input of the FIFOs 825a and 825b. Multiplexer 850 alternately selects between its inputs, thus interleaving the data from outputs of the flip-flops. Accordingly, output bits in the sequence A, E, B, F, C, G, D, and H are provided to pads P1 810 and P2 820.

Figure 10:
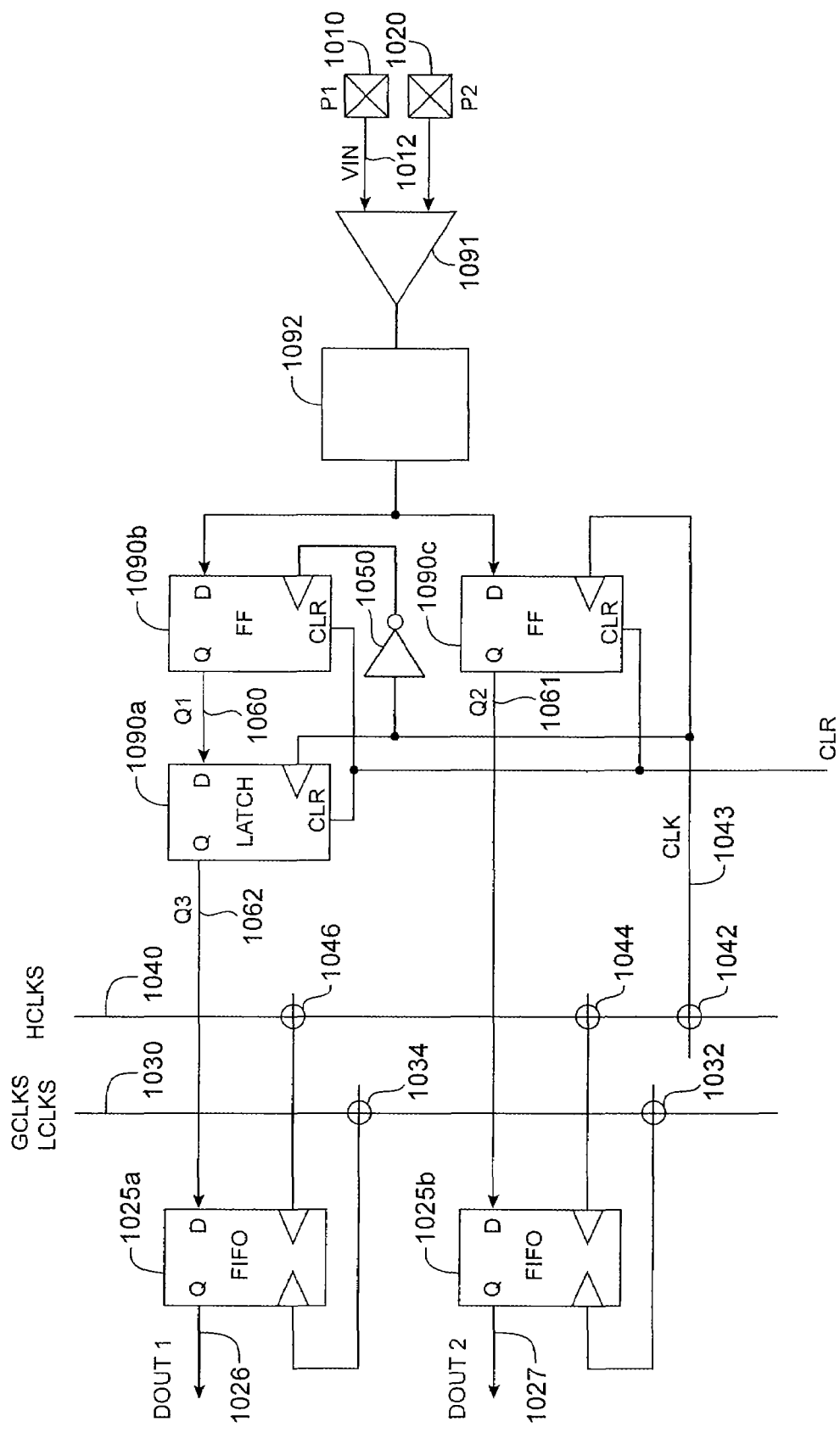
FIG. 10 is a block diagram showing more detail of a high-speed differential input which may be used as HSIN in FIG. 6, the high-speed input register and differential input buffer in FIG. 7, or other circuits in other embodiments of the present invention

FIG. 10 is a block diagram showing more detail of a high-speed differential input which may be used as HSIN 690 in FIG. 6, the high-speed input register 790 and differential input buffer 791 in FIG. 7, or other circuits in other embodiments of the present invention. Included are FIFOs 1025a and 1025b, flip-flops 1090b and 1090c, latch 1090a, and input buffer 1091. The FIFOs 1025a and 1025b may alternately be one FIFO having two inputs. As in the other figures, these FIFOs may, for example, be one FIFO having two input and two output ports. Also, the input and output ports may be configurable, and the input ports may share a clock, while the output ports share a different clock.

The flip-flops 1090b and 1090c, and latch 1090a form a double-data rate input register. The latch 1090a may alternately be a third flip-flop. Multiplexers or pass devices may be inserted in the CLK 1043, Q1 1062, Q2 1061, or register data input paths to deactivate this high-speed input path and save power. It will be appreciated by one skilled and the art that other modifications may be made to this circuitry consistent with the present invention.

Input signals are received on pads P1 1010 and P2 1020 by the input buffer 1091. Input buffer 1091 provides inputs to flip-flops 1090b and 1090c. A high-speed clock signal is selected from one of the HCLKs clock lines 1040 by pass devices 1042. The clock signal is applied on line 1043 to flip-flop 1090c and latch 1090a, and is inverted by inverter 1050 and sent to flip-flop 1090b. Data from the input buffer 1091 is latched on rising edges of the clock by flip-flop 1090c and by falling edges of the clocked by flip-flop 1090b. Data stored by the flip-flop 1090b is retimed by latch 1090a, such that signals Q2 1061 and Q3 1062 are sent to the FIFOs 1025a and 1025b on rising edges of the clock. FIFOs 1025a and 1025b buffer the data and provide it at a lower frequency on lines DOUT1 1026 and DOUT2 1027 to the core circuits.

Since the signal Vin 1012 is latched on rising edges of the clock by flip-flop 1090c and on falling edges of the clock by flip-flop 1090b, the resulting data rate at Q3 1062 and Q2 1061 are half that of Vin 1012. In other words, the flip-flops 1090a and 1090b perform a two bit serial-to-parallel conversion of the input data. This concept may be further expanded at FIFOs 1025a and 1025b. For example, four bits received serially may be output in parallel at FIFO outputs DOUT1 1026 and DOUT2 1027. In this way, a frequency translation by a factor of eight from the input signal Vin 1012 and DOUT1 1026 and DOUT2 1027 is achieved. In other embodiments, more or less than 4 bits may be converted from serial to parallel data by the FIFOs 1025a and 1025b, thereby achieving a different overall frequency translation.

Figure 11A:
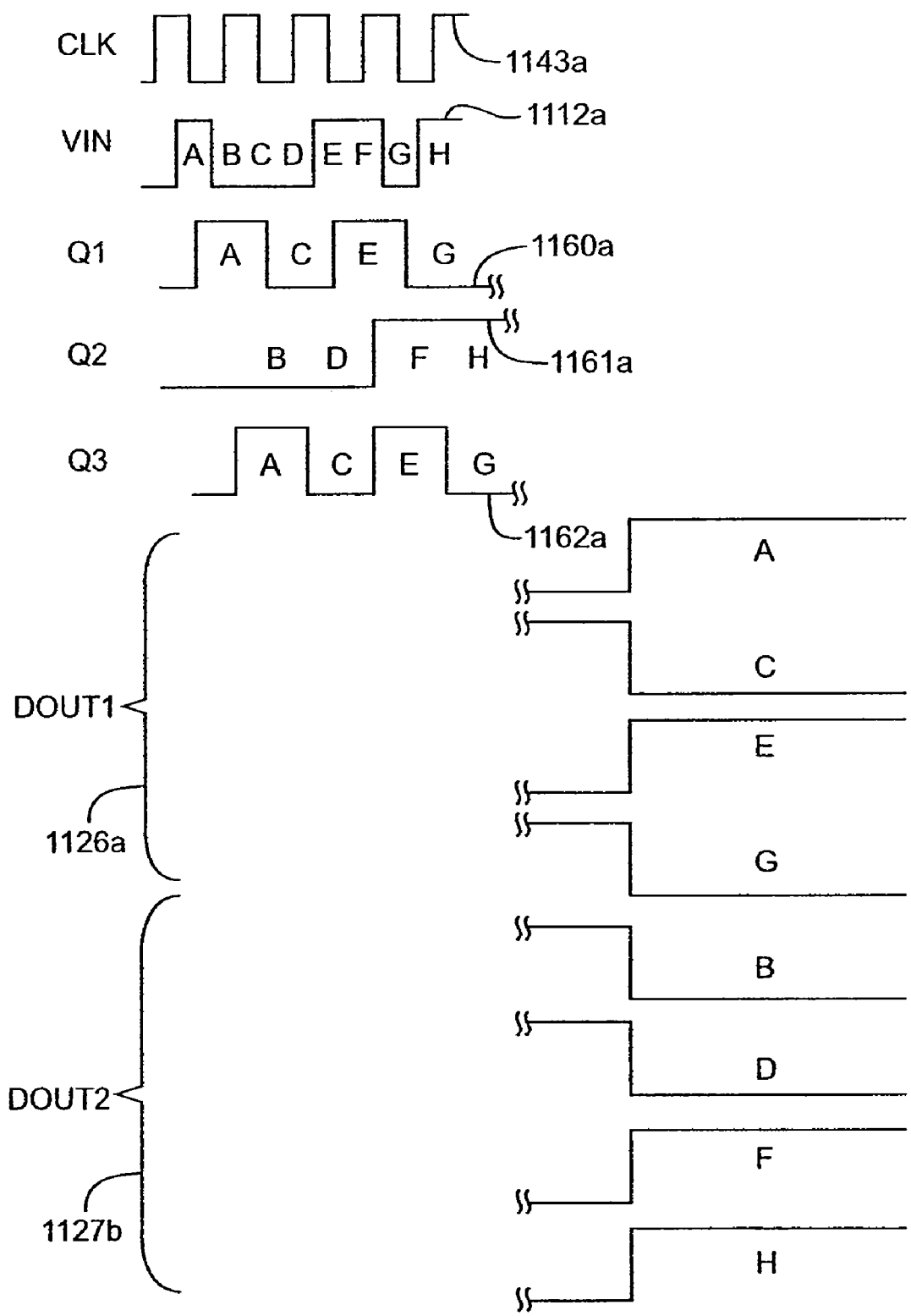
FIG. 11A is a timing diagram illustrating the operation of the input circuitry of FIG. 10.

FIG. 11A is a timing diagram illustrating the operation of the input circuitry of FIG. 10. Included are clock signal 1143a, input signal 1112a, flip-flop outputs Q1 1160a and Q2 1161a, latch output Q3 1162a, and FIFO outputs DOUT1 1126a and DOUT2 1127a. In this example, a portion of the input signal VIN 1112a includes the sequence of data bits A, B, C, D, E, F, and G. Clock signal 1143a latches the input signal 1112a into each flip-flop on alternating rising and falling edges, resulting in waveforms Q1 1160a and Q2 1161a. Typically, the clock signal 1143a is in quadrature with the input signal VIN 1112a. This is referred to as "window centering" and minimizes data errors at the input register. Q1 1160a is delayed one-half of a clock cycle by the latch 1090a to form signal 1162a. These signals, Q2 1161a and Q3 1162a are stored and output in parallel at a lower frequency as waveforms DOUT1 1126a and DOUT2 1127a by FIFOs 1025a and 1025b.

FIG. 11B is a timing diagram illustrating an alternative operation of the input circuitry of FIG. 10. Included are clock signal 1143b, input signal 11 12b, flip-flop outputs Q1 1160b and Q2 1161b, latch output Q3 1162b, and FIFO outputs DOUT1 1126b and DOUT2 1127b. In this example, a portion of the input signal VIN 1112b includes the sequence of data bits A, B, C, D, E, F, and G. Clock signal 1143b latches the input signal 1112b into each flip-flop on alternating rising and falling edges, resulting in waveforms Q 1 1160b and Q2 1161b. Q1 1160b is delayed one-half of a clock cycle by the latch 1090a. These signals, Q2 1161b and Q3 1162b are buffered and output at a lower frequency as waveforms DOUT1 1126b and DOUT2 1127b by FIFOs 1025a and 1025b. Again, the clock signal 1143b is often in (or nearly in) quadrature with the input signal VIN 1112b. Alternately, the input signal may be timed such that the set-up and hold times of the input flip-flops are met.

Figure 12:
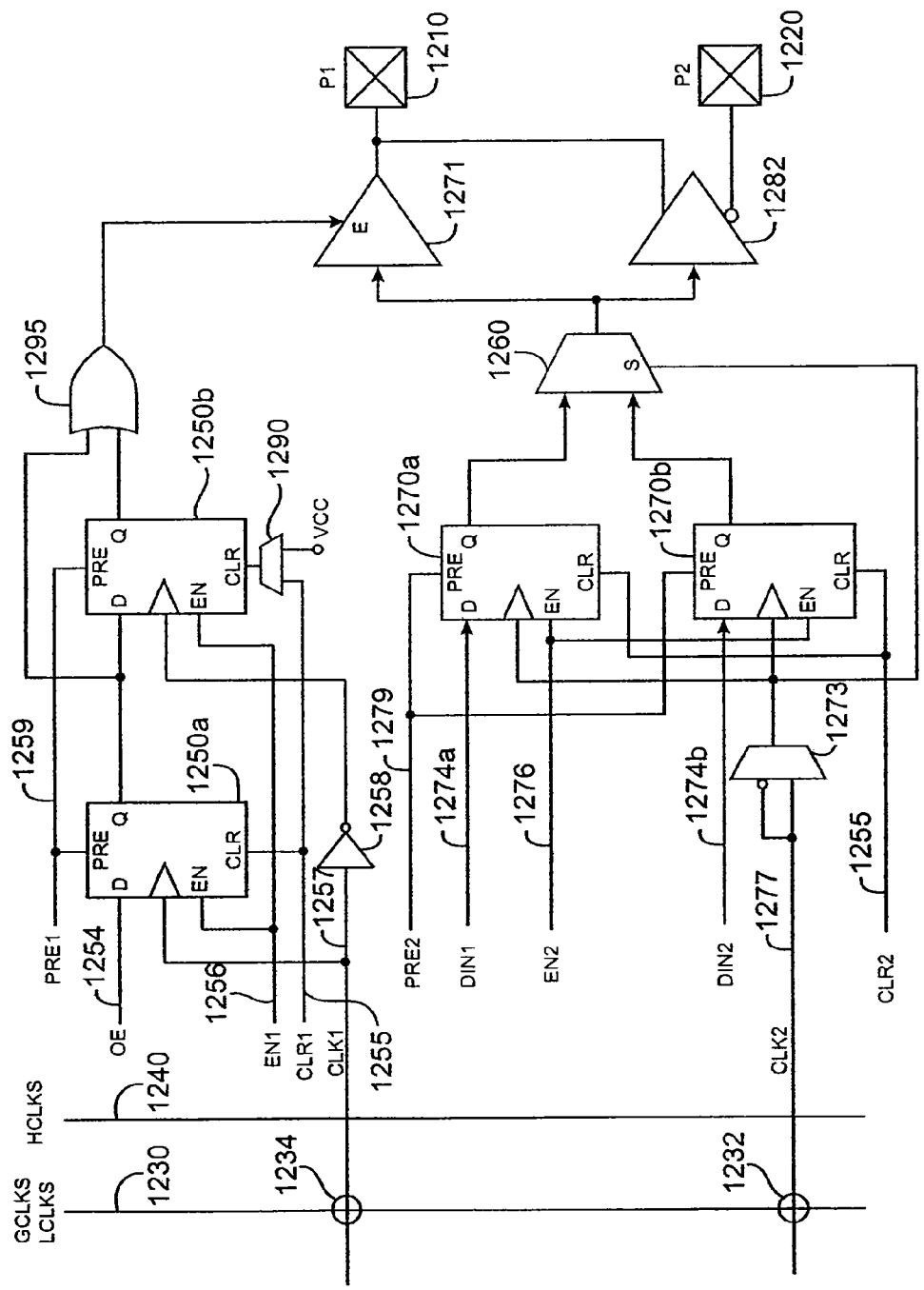
FIG. 12 is a more detailed block diagram of an output circuit that may be used as the output and output enable circuits and in FIG. 6, or the output register, the output enable register and output buffers in FIG. 7, or other circuits in other embodiments of the present invention.

FIG. 12 is a more detailed block diagram of an output circuit that may be used as the output and output enable circuits 670 and 660 in FIG. 6, or the output register 770, output enable register 760, and output buffers 771 and 782 in FIG. 7, or other circuits in other embodiments of the present invention. Included are output registers 1270a and 1270b, multiplexers 1260 and 1290, clock multiplexer 1273, single-ended output buffer 1271, differential output buffer 1282, output enable registers 1250a and 1250b, and OR gate 1295. The flip-flops 1270a and 1270b, and multiplexer 1260 form a double-data rate output register. Multiplexer or pass gates may be inserted in the register data or clock input paths to deactivate this output path. Additionally, multiplexers may be used to provide an output path directly from one register or the core circuits to one or both of the output buffers It will be appreciated by one skilled and the art that other modifications may be made to this circuitry consistent with the present invention.

Data signals are received on lines 1274a and 1274b from the core circuits or FIFOs. A clock signal on line 1277 is selected from one of the global or local clocks 1230 by pass devices 1232. The clock multiplexer 1273 selects true or complementary versions of this clock signal and drives the clock inputs of the flip-flops 1270a and 1270b and the select input of the data multiplexer 1260. Outputs are provided by the flip-flops 1270a and 1270b to the multiplexer 1260 where they are interleaved and used to drive either of the output buffers 1271 or 1282. If the output buffer 1271 is selected, it drives a single-ended output onto pad P1 1210. If the differential output buffer 1282 is active, it drives a differential output onto pads P1 1210 and P2 1220.

Output buffer 1271 is enabled by the OR gate 1295, which is driven by enable registers 1250a and 1250b. Specifically, an output enable signal on line 1254 is received by flip-flop 1250a which drives flip-flop 1250b. The outputs of flip-flops 1250a and 1250b are ORed by OR gate 1290, which drives the enable input of the output buffer 1271. This configuration allows the enable registers to enable and disable the output buffer 1271 on consecutive rising and falling edges (or consecutive falling and rising edges). In this way, the output buffer 1271 may be dynamically tristated or enabled. Alternately, multiplexer 1290 may select a logic high (or VCC), thus clearing the flip-flop 1250b. This allows flip-flop 1250a to enable and disable the output buffer 1271 on consecutive rising edges of the CLK1 signal on line 1257. Also, in each of these cases, there may be one or more intermediate clocks between enables and disables (or disables and enables).

Since this signal path is generally expected to be used for low or moderate frequency signals, flip-flops 1270a and 1270b, and output buffer 1271 can support a higher level of functionality than the flip-flops and output buffer is used in the higher speeds signal path. In this example, each flip-flop has preset, clear, and enable signal inputs associated with it, while the output buffer has an enable input such that it can provide a high impedance output. In this example, separate preset, enable, and clear lines are provided to the data output flip-flops and the output enable flip-flops. In other embodiments, the signal lines may be coupled together, or some of these functions may be omitted. Alternately, each flip-flop and may have a separate signal line for one or more of these functions. Also, other signals may be supported by these circuits.

Figure 13:
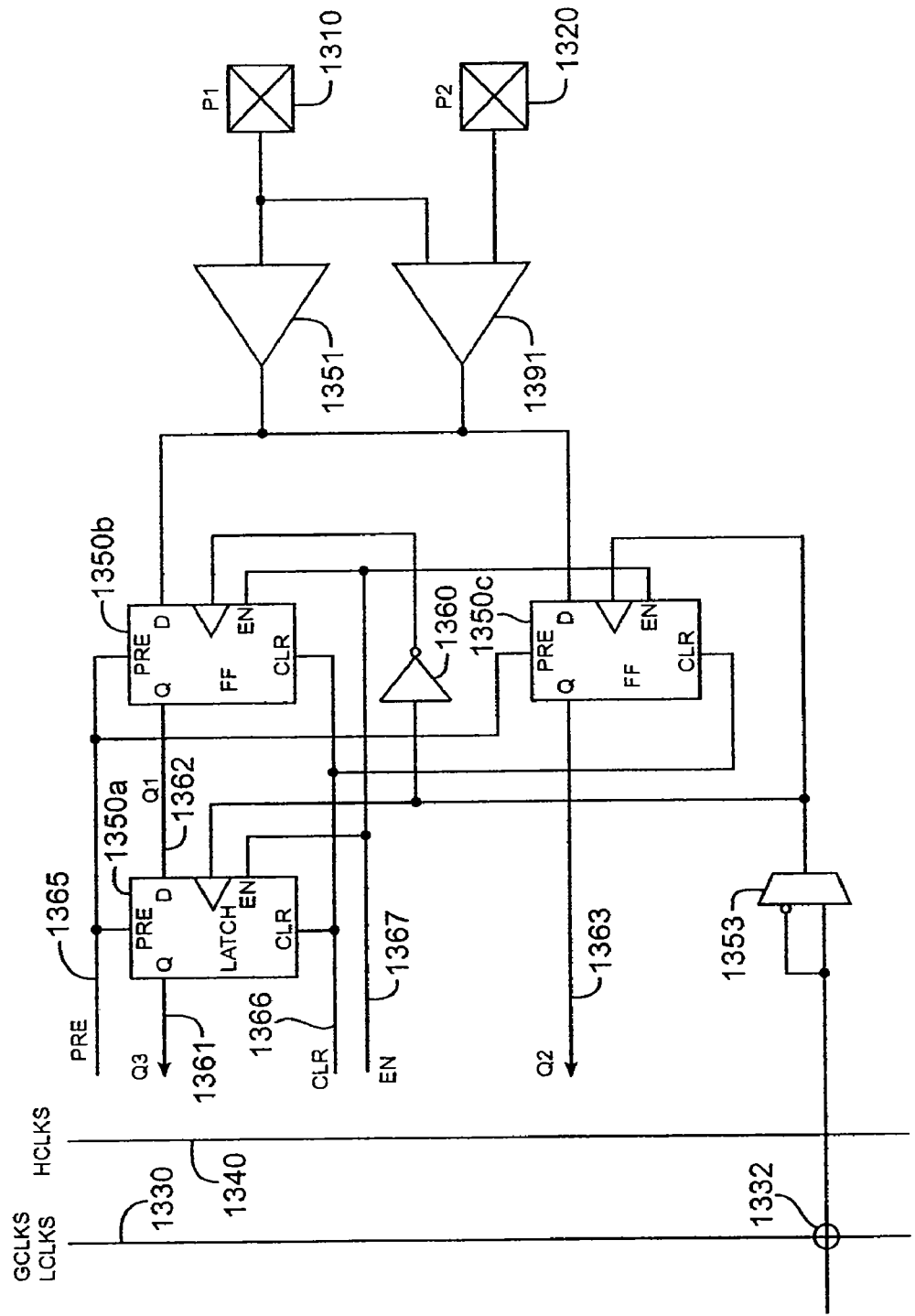
FIG. 13 is a more detailed block diagram showing an input circuits which may be used as the input circuit in FIG. 6, the input register and input buffer of FIG. 7, or other circuits in other embodiments of the present invention.

FIG. 13 is a more detailed block diagram showing an input circuits which may be used as the input circuit 650 in FIG. 6, the input register 750 and input buffer 751 of FIG. 7, or other circuits in other embodiments of the present invention. Included are single-ended input buffer 1351, differential output buffer 1391, latch 1350*a*, flip-flops 1350*b* and 1350*c*, and clock multiplexer 1353. Alternately, the latch 1350*a* may be a flip-flop. Multiplexers may be inserted in the register data or clock input paths to deactivate this lower-speed input path. One skilled in the art will appreciate that other modifications may be made to this circuitry consistent with the present invention.

Single-ended signals are received on pad P1 1310 by input buffer 1351 which provides an input to flip-flops 1350*b* and 1350*c*. Differential inputs are received on pads P1 1310 and P2 1320 by differential input buffer 1391. The inputs of the flip-flops 1350*b* and 1350*c* are stored on alternate edges of the clock. The output of flip-flop 1350*b* is retimed by the latch 1350*a*. The clock signal is selected from one of the global or local clocks 1330 by pass devices 1332. True or complementary versions of the selected clock signal are provided by multiplexer 1353 to flip-flop 1350*c* and latch 1350*a*. This signal is inverted by inverter 1360, which in turn drives flip-flop 1350*b*. The outputs of the latch 1350*a* and flip-flop 1350*c*, Q3 1361 and Q2 1363, are provided to FIFOs or core circuitry. As before, since this circuitry is intended for low or moderate frequency input signals, flip-flops and latches having higher levels of functionality may be used. In the specific example shown, each flip-flop and latch has preset, clear, and enable input signal lines. In other embodiments, other inputs signal lines may be used, or some of the shown inputs may be omitted. In the specific example, one preset 1365, 1 clear 1366, and enabled 1367 are shown as being connected to each flip-flop and latch. In other embodiments of the present invention, some or all of these circuits may be connected to separate lines.

Figure 14:
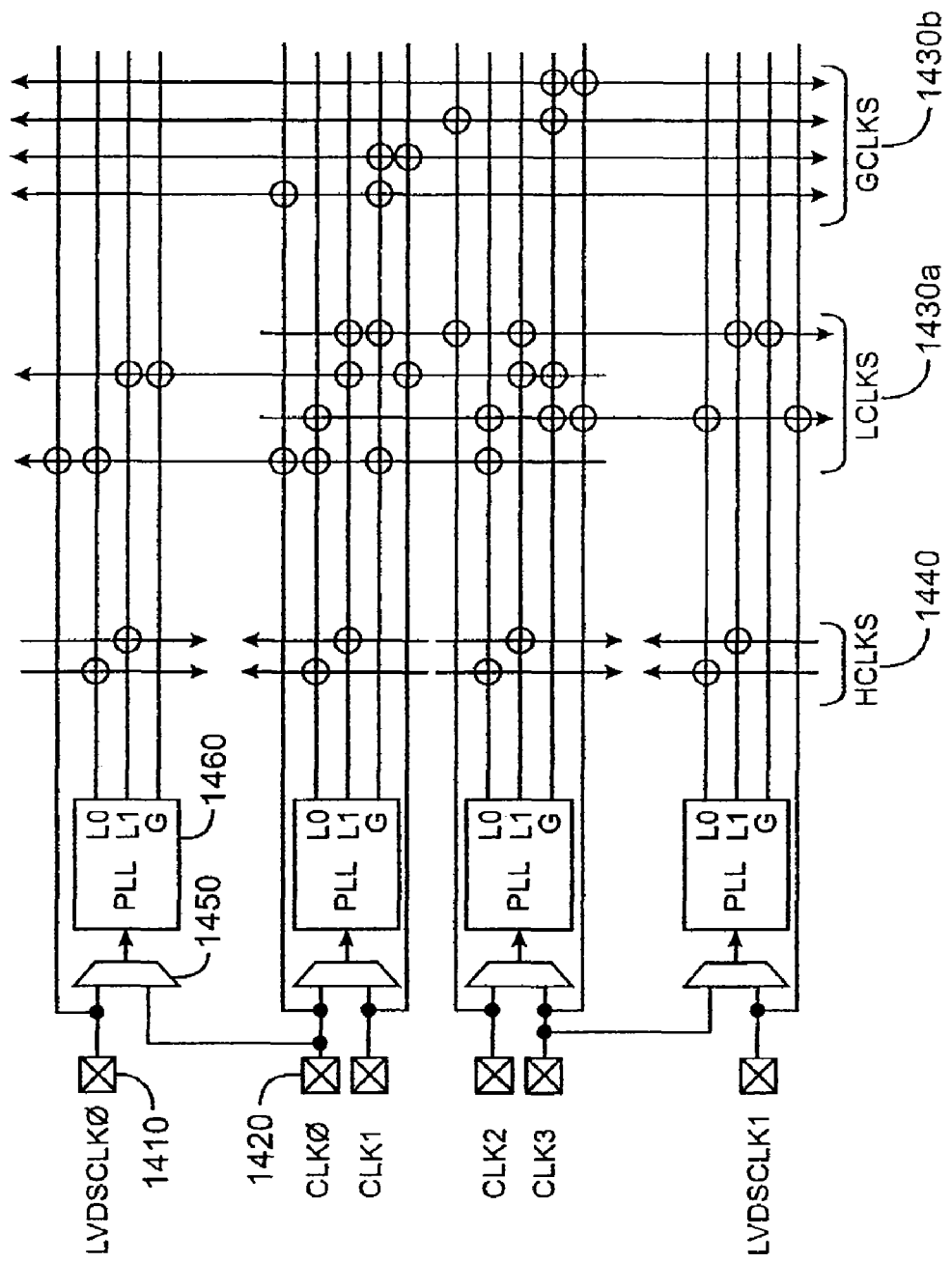
FIG. 14 is a block diagram showing the phase-locked loops that are used to generate the global, local, and high-speed clocks used in an embodiment of the present invention.

FIG. 14 is a block diagram showing the phase-locked loops that are used to generate the global, local, and high-speed clocks used in an embodiment of the present invention. Included are LVDSCLK input pads 1410, clock input pads 1420, multiplexers 1450, and phase-locked loops 1460. These circuits generate the HCLKs 1440 LCLKs 1430*a* and HCLKs 1430*b*. In this example, the LVDSCLK inputs can be configured as clock inputs or as input output pads. The clock input pads 1420 are dedicated clock inputs. Each clock input pads 1420 can be two individual pads for receiving differential inputs, or one pad for receiving single-ended inputs. Each multiplexer 1450 selects from one of two of input signals and provides a reference clock to the phase-locked loop 1460. The outputs of the PLLs are selectable as the local, global, or high-speed clock lines. In a specific embodiment of the present invention, the circuits shown in FIG. 14 is replicated once on each side of an integrated circuit. Accordingly, each HLCK 1440 is routed through one-fourth of each side of the integrated circuit, or one-sixteenth of the total periphery. Also, each quarter of the integrated circuits has four local clock lines available, while there are 16 total global clock lines throughout the integrated circuit.

Figure 15:
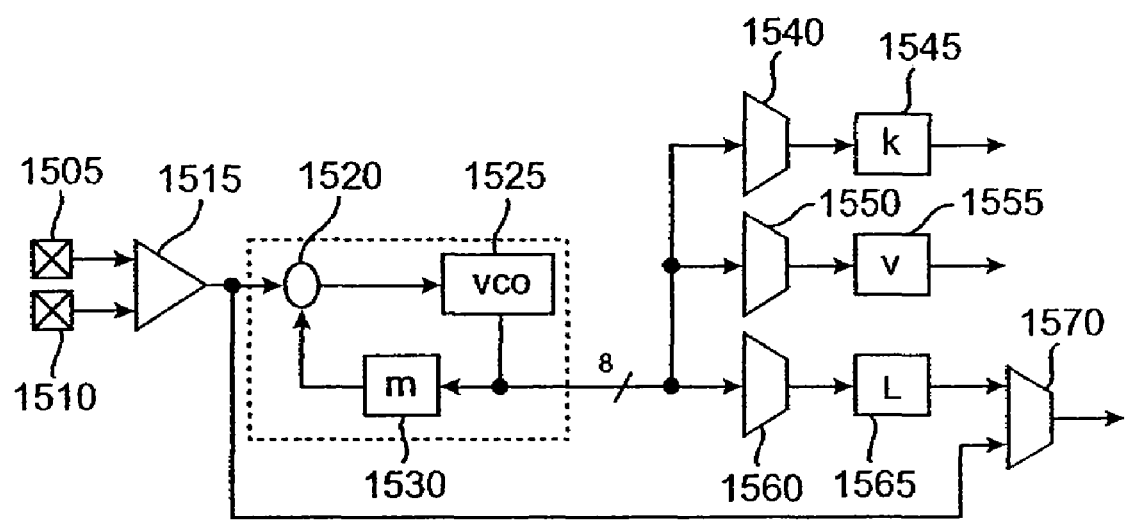
FIG. 15 is an example of the phase-locked loop that may be used as the phase-locked loop in FIG. 14.

FIG. 15 is an example of the phase-locked loop that may be used as the phase-locked loop 1460 in FIG. 14. Included are input pads 1505 and 1510, input buffer 1515, summing node 1520, voltage-controlled oscillator 1525, frequency divider 1530, multiplexers 1540, 1550, 1560, and 1570, and dividers 1545, 1555 and 1565. Single-ended or differential reference clock input signals are received on pads 1505 and 1510 and drive input buffer 1515. VCO 1525 generates a clock signal which is divided by divider 1530 and phase compared to the buffered reference clock signal at summing node 1520. Differences in phase between the signals result in an error signal or control voltage that adjusts the VCO frequency.

VCO 1525 may be a ring oscillator or similar structure such that clock signals having the various phases may be provided to the multiplexers 1540, 1550, and 1560. In a specific embodiments, the VCO comprises four differential stages. In other embodiments, the number of stages may vary. In this embodiment, clocks having phases shifted by 0, 45, 90, 135, 180, 225, 270, and 315 degrees are available. In other embodiments of the present invention, a different number of lines, and lines having different phases may be available from the VCO. Multiplexers 1540, 1550, and 1560 select one of the available inputs and drive dividers 1545, 1555 and 1565. Dividers 1545, 1555, and 1565 divide their input frequencies by K, V, and L. In a specific embodiment, K, V, and L are programmable integer values between 1 and 16. In other embodiments, these may be fixed values, or they may be variable along a different range, or different ranges of values. Multiplexer 1570 selects between the output of divider 1565 and the output of the input buffer 1515. In various embodiments, the outputs of the dividers 1545 and 1555, and the output of multiplexer 1570 may be selectable as high-speed, local, or global clock signals. An example of this is shown in FIG. 14.

The foregoing description of specific embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A method of providing and receiving signals comprising:
   providing a first single-ended signal by:
      disabling a high-speed differential input buffer having a first input coupled to a first pad;
      providing the first single-ended signal to a low-speed output buffer using a first double-data rate register;
      enabling the low-speed output buffer using a tristate register comprising a first flip-flop and a second flip-flop, the second flip-flop having an input coupled to an output of the first flip-flop; and
      providing the first single-ended signal on the first pad using the low-speed output buffer; and
   receiving a second single-ended signal by:
      disabling the high-speed differential input buffer having a second input coupled to a second pad; and
      receiving the second single-ended signal on the second pad using a low-speed input buffer.

2. The method of claim 1 further comprising:
   providing the second single-ended signal to a second double-data rate register using the low-speed input buffer, wherein the second double data-rate register comprises:
      a first flip-flop;
      a second flip-flop; and
      a third flip-flop having an input coupled to an output of the first flip-flop.

3. The method of claim 1 further comprising:
   providing the second single-ended signal to a serial-to-parallel converter using the low-speed input buffer.

4. The method of claim 1 further comprising:
delaying the second single-ended signal using an adjustable delay line.

5. The method of claim 1 further comprising:
providing the first single-ended signal to the first double-data rate register using a parallel-to-serial converter.

6. A method of providing and receiving signals comprising:
providing a first single-ended signal by:
disabling a high-speed differential input buffer having a first input coupled to a first pad and a second input coupled to a second pad;
providing the first single-ended signal to a first low-speed output buffer using a first output double data-rate register; and
providing the first single-ended signal on the first pad using the first low-speed output buffer;
providing a second single-ended signal by:
disabling the high-speed differential input buffer having the first input coupled to the first pad and the second input coupled to the second pad;
providing the second single-ended signal to a second low-speed output buffer using a second output double data-rate register; and
providing the second single-ended signal on the second pad using the second low-speed output buffer; and
receiving a first differential signal by:
receiving the first differential signal on the first pad and the second pad using the high-speed differential input buffer;
receiving an output from the high-speed differential input buffer using an input double data-rate register comprising a first flip-flop having an input coupled to the output of the high-speed differential input buffer, a second flip-flop having an input coupled to the output of the high-speed differential input buffer, and a third flip-flop having an input coupled to an output of the first flip-flop.

7. The method of claim 6 further comprising:
providing an output from the input double data-rate register to a serial-to-parallel converter.

8. The method of claim 6 further comprising:
delaying the first differential signal using an adjustable delay line.

9. The method of claim 6 further comprising:
while providing the first single-ended signal, enabling first low-speed output buffer using an output enable register comprising a first flip-flop; and a second flip-flop having an input coupled to an output of the first flip-flop and an output coupled to an enable input of the first low-speed output buffer.

10. The method of claim 6 further comprising:
while providing the first single-ended signal, providing the first single-ended signal to the first output double data-rate register using a parallel-to-serial converter.

* * * * *